United States Patent [19]

Matsuura et al.

[11] Patent Number: 4,702,606
[45] Date of Patent: Oct. 27, 1987

[54] POSITION DETECTING SYSTEM

[75] Inventors: Toshio Matsuura, Koshigaya; Seiro Murakami; Yuji Imai, both of Tokyo; Kazuya Ohta, Kawasaki; Akikazu Tanimoto, Yokohama, all of Japan

[73] Assignee: Nippon Kogaku K.K., Tokyo, Japan

[21] Appl. No.: 737,434

[22] Filed: May 24, 1985

[30] Foreign Application Priority Data

Jun. 1, 1984 [JP] Japan .................. 59-112370
Jun. 11, 1984 [JP] Japan .................. 59-119463

[51] Int. Cl.$^4$ ............................................. G01B 11/00
[52] U.S. Cl. .................................... 356/401; 356/400
[58] Field of Search ............. 355/53; 356/399, 400, 356/401; 250/557

[56] References Cited

U.S. PATENT DOCUMENTS

| 3,811,779 | 5/1974 | Jacobs et al. | 356/400 |
| 4,265,542 | 5/1981 | Snow | 356/400 |
| 4,423,959 | 1/1984 | Nakazawa et al. | 356/401 |
| 4,531,060 | 7/1985 | Suwa et al. | 356/400 |
| 4,550,374 | 10/1985 | Meshman et al. | 356/401 |
| 4,553,845 | 11/1985 | Kuroki et al. | 356/401 |
| 4,566,795 | 1/1986 | Matsuura et al. | 356/401 |

Primary Examiner—F. L. Evans
Attorney, Agent, or Firm—Shapiro and Shapiro

[57] ABSTRACT

An alignment system includes an element bearing a plurality of patterns on the surface thereof, the plurality of patterns being arranged in a predetermined direction, a stage for holding the element, scanning means for scanning the plurality of patterns of the element held by the stage in the predetermined direction and making position signals indicative of the positions of the plurality of patterns in the predetermined direction on the element, and operation means for operating and putting out a signal indicative of a position which is in a predetermined relation with the positions of the plurality of patterns in the predetermined direction, on the basis of the position signals.

16 Claims, 16 Drawing Figures

POSITION DETECTING SYSTEM

BACKGROUND OF THE INVENTION

1. Field of the Invention

This invention relates to a system for detecting an alignment mark formed on a substrate or the like and effecting the position detection of the substrate, and in particular to a position detecting system suitable for an exposure apparatus for manufacturing semiconductor elements.

2. Description of the Prior Art

The tendency of large scale integrated circuit (LSI) patterns toward minuteness is progressing every year, and reduction projection type exposure apparatuses have become popular as circuit pattern printing apparatuses which satisfy the requirement for the tendency toward minuteness and which are high in productivity. In these apparatuses heretofore used, a reticle pattern several times (e.g., five times) as large as the pattern to be printed on a silicon wafer is reduction-projected by a projection lens and what is printed in a cycle of exposure is an area on the wafer smaller than a square of diagonal length 21 mm. Accordingly, to print the pattern on the whole surface of a wafer having a diameter of the order of 125 mm, the so-called step-and-repeat system whereby a wafer is placed on a stage and moved by a predetermined distance and then exposure is repeated is adopted.

In the manufacture of LSI, several or more layers of patterns are successively formed on a wafer, but unless the superposition error (positional deviation) of the pattern between different layers is of a predetermined value or less, the conductive or insulative state between the layers will not become what is intended and the function of LSI cannot be performed. For example, for a circuit of a minimum line width of 1 $\mu$m, only a positional deviation of the order of 0.2 $\mu$m at greatest is allowed.

In the reduction projection exposure system, as a method of superposing patterns one upon the other, namely, a method of superposing the projected image of the pattern on a reticle and the already formed pattern on a wafer one upon the other, there are two methods, i.e., the off-axis type method and the through-the-lens (hereinafter referred to as TTL) type method. In any of these two methods, the alignment mark on the wafer is detected and the alignment of the wafer relative to the apparatus is effected, but it is difficult to obtain high superposition accuracy in every layer. This has been caused by the fact that due to the size of the particles of the crystal on the wafer becoming large, the surface of the wafer becomes rough or the reflection factor thereof is irregular and therefore the detected position of the mark of the wafer deviates from the actual position of the mark. Particularly, where the surface of the wafer is covered with a thin film of aluminum, this phenomenon is substantial, and this has led to a disadvantage that the superposition accuracy is substantially reduced.

Also, the ordinary alignment by the TTL system is effected by detecting through a projection lens the patterns already formed on the wafer, namely, the two marks attendant to a chip. The two marks, for example, in accordance with the two-dimensional alignment direction of the wafer, are formed by a linear pattern elongately extending in x direction and a linear pattern elongately extending in y direction orthogonal to the x direction, and they are provided on different portions around the chip. Such two marks are detected by discrete alignment optical systems through the projection lens. The actual wafer alignment procedure has usually comprised substantially positioning a chip to be aligned in the projection area (image field) of the projection lens, thereafter effecting the y direction positioning of a stage so that the y direction position of the mark extending in x direction is aligned by one alignment optical system, and then effecting the x direction positioning of the stage so that the x direction position of the mark extending in y direction is aligned by the other alignment optical system. Accordingly, the x direction and y direction position detections, i.e., two position detecting operations, become necessary, and this has led to a disadvantage that the speed of alignment is limited.

SUMMARY OF THE INVENTION

It is an object of the present invention to provide a position detecting system for enabling the projected image of the pattern on a reticle and the pattern on a wafer to be superposed one upon the other at a high speed and at high accuracy.

It is another object of the present invention to provide a high-speed position detecting system which does not discretely effect the operations of detecting the positions of a substrate in two directions orthogonal to each other.

To achieve the above objects, in the system of the present invention, a plurality of alignment marks on a substrate such as a wafer are arranged in a predetermined direction, and then light information (such as scattered light or diffracted light) obtained from the alignment marks by scanning the alignment marks by a light spot is photoelectrically converted, and on the basis of photoelectric signals obtained when the plurality of alignment marks are scanned, the positions of the plurality of marks are detected and by effecting an operation such as an averaging process, a weighted averaging process or a minimum square approximation process on these scan positions, positional information is detected in which the amount of deviation attributable to the shape of the alignment marks, the state of the surface of the substrate, or the alignment detection, etc. is decreased.

To achieve said another object, the system of the present invention is constructed such that a substrate having an alignment mark in one of two directions orthogonal to each other and an alignment mark in the other direction is scanned by a light spot in a direction intersecting one of the two orthogonal directions at a predetermined angle, whereby the relative position of the substrate in the system is detected.

DESCRIPTION OF THE PREFERRED EMBODIMENTS

Figure 1A:
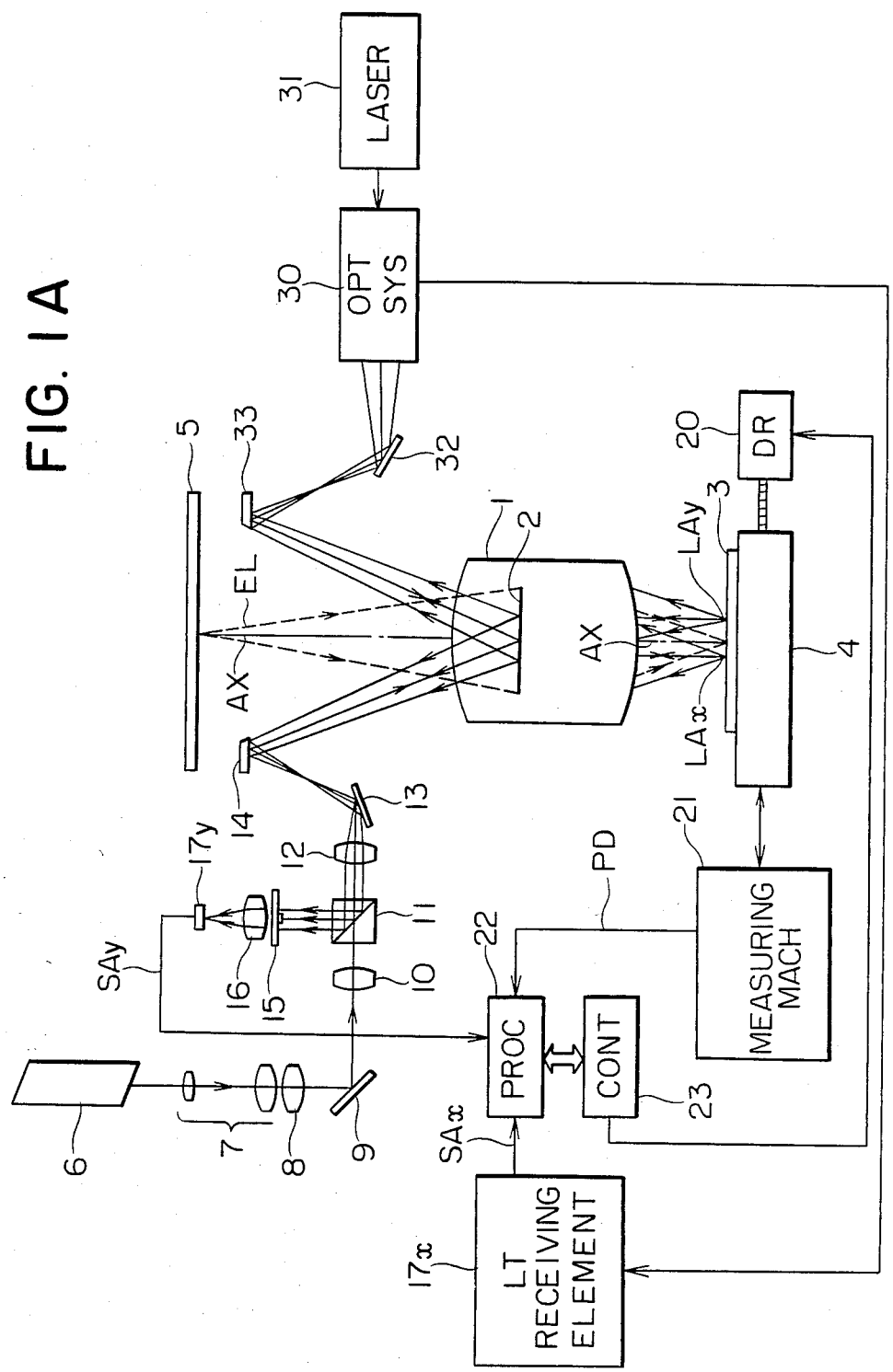
FIG. 1A schematically shows the construction of the position detecting apparatus of the present invention.

As shown in FIG. 1A, a reduction projection lens (hereinafter simply referred to as the projection lens) 1 projects onto a wafer 3 the image of a circuit pattern or the like formed on a reticle 5 while reducing the image to 1/5 or 1/10. The reticle 5 is placed on a reticle stage, not shown, which is finely moved in X and Y directions and $\theta$ (rotation) direction by a driving portion, not shown. The reticle 5 is then aligned at a predetermined position, for example, relative to the optic axis AX of the projection lens 1 by the use of an alignment microscope, not shown. Also, the reticle 5 is illuminated by an exposure light including a wavelength effective to sensitize the photoresist applied to the wafer 3 (for example, g-line or i-line). By the illumination of this exposure light, a light beam EL forming the pattern image of the reticle 5 is imaged on the surface of the wafer 3. The wafer 3 is placed on a stage 4 two-dimensionally movable in X and Y directions. Although not shown, the stage 4 has a Z stage portion for vertically moving the wafer 3 and a $\theta$ table provided on the Z stage portion to finely rotate the wafer 3. The two-dimensional movement of the stage 4 is accomplished by a driving part (a motor or the like) 20, and the position (coordinates value) of the stage 4 in an XY coordinates system is always detected, for example, at a resolving power of 0.02 $\mu$m by a measuring machine 21 such as a laser interferometer.

The alignment detecting optical system for the wafer 3 will now be described. The laser light from a laser light source 6 is expanded to a predetermined beam diameter by a beam expander 7 and shaped into a beam of elongated elliptical cross-section by a cylindrical lens 8. This shaped laser beam is reflected by a mirror 9, passes through a lens 10, a beam splitter 11 and a lens 12, and is reflected upwardly toward the underside of the reticle 5 by a mirror 13. The laser beam from the mirror 13 is first converged into the form of a slit, whereafter it passes to a mirror 14 having a reflecting flat surface parallel to the reticle 5 below the reticle 5, and there the laser beam is reflected toward the entrance pupil 2 of the projection lens 1.

Figure 1B:
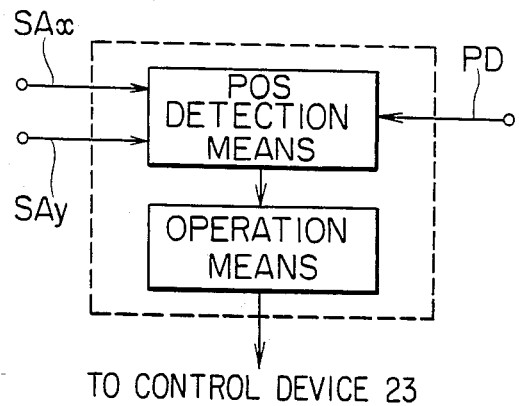
FIG. 1B is a block diagram of the processing circuit shown in FIG. 1A.

The laser beam passed through the projection lens 1 is imaged into an elongated band-shaped light spot $LA_y$ on the wafer 3 by the action of the cylindrical lens 8. An alignment mark is pre-formed on the wafer 3 and therefore, when the spot light $LA_y$ irradiates this mark, scattered light and diffracted light are produced from the mark. In the present embodiment, the mark is a diffraction grating-like pattern and therefore, regularly reflected light (0-order diffracted light) and diffracted light (1st-order and higher order light) of the light spot $LA_y$ are produced from the mark. The light information from the mark conversely enters the projection lens 1, passes through the entrance pupil 2, is reflected by the mirrors 14 and 13, passes through the lens 12, is reflected by the beam splitter 11 and arrives at a space filter 15. The space filter 15 is conjugate with the entrance pupil 2 of the projection lens 1 and intercepts only the regularly reflected light (0-order diffracted light) from the surface of the wafer 3. The scattered light (diffracted light) from the surface (mark) of the wafer 3 is displaced relative to the optical path of the regularly reflected light by a spatial frequency. So, the space filter 15 passes therethrough only the scattered light and diffracted light, and a condensing lens 16 condenses those scattered light and diffracted light on a light receiving element $17_y$ serving as a photoelectric detector. The light receiving element $17_y$ puts out a photoelectric signal $SA_y$ corresponding to the intensity of the scattered light or the diffracted light, and this photoelectric signal $SA_y$ is input to an alignment signal processing circuit 22. Likewise, the laser beam from a laser light source 31 is directed to the wafer 3 through an optical system 30 in which the same optical elements as the aforementioned optical elements 7, 8, 9, 10, 11, 12, 15 and 16 are constructed in a similar manner, and mirrors 32 and 33. The laser beam from the laser light source 31 becomes scattered light and diffracted light on the wafer 3, and is directed to a light receiving element $17x$ through the mirrors 32, 33 and the optical system 30. The light receiving element $17x$ puts out a photoelectric signal SAx. The processing circuit 22 also receives as an input the positional information PD (a time-serial up-down pulse signal or a parallel digital signal) from the measuring machine 21 and detects the generated positions (the scanning positions) of the photoelectric signals SAx and SAy corresponding to the diffracted light from the mark. More specifically, the processing circuit 22 samples the photoelectric signals SAx and SAy by the pulse signal PD generated for each unit amount of movement (0.62 $\mu$m) of the stage 4, converts each sampling value into a digital value and causes it to be stored in a memory in the order of address, whereafter it detects the scanning position of the mark by a predetermined operation process. This operation is such that the sampling value is compared with a predetermined value and the average of the position when the sampling value exceeds the predetermined value and the position when the sampling value is below the predetermined value is adopted. Further, the processing circuit 22 also effects, as an example, the operation of averaging the scanning positions of the plurality of marks on the wafer 3. As shown in FIG. 1B, the processing circuit 22 includes position detection means for detecting the position of the mark and operation means for effecting an operation such as averaging. A controlling device 23 controls the driving part 20 on the basis of the positional information of the mark determined by the averaging. On the wafer, a pattern corresponding to the circuit is formed at a plurality of locations by one or more exposure operations. The area in which this pattern corresponding to the circuit is formed is a chip. If the mark on the wafer 3 is provided attendantly to each of the chips on the wafer, the center of the chip and the optic axis AX of the projection lens 1 (or the projected image of the central point of the reticle 5) can be accurately aligned.

Figure 2:
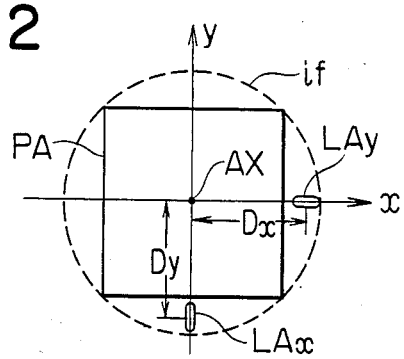
FIG. 2 is a plan view showing the arrangement of light spots in the image field of a projection lens.

When, as shown in FIG. 2, the optic axis AX of the projection lens 1 is determined so as to pass through the origin of the orthogonal coordinates system XY, a light spot light LAy is formed so as to be elongate on the x-axis in x direction and a light spot LAx is formed so as to be elongate on the y-axis in y direction. These light spots need not always be positioned on the x-axis and the y-axis, respectively, but for simplicity of description, it is to be understood that they are coincident with the x-axis and the y-axis, respectively. The light spot LAy is used for the detection of the y direction position of the alignment mark extending in x direction on the wafer 3, and the light spot LAx is used for the detection of the x direction position of the alignment mark extending in y direction on the wafer 3. Also, as is apparent from FIG. 2, the positions of the light spot LAy and LAx are determined so as to be inside the image field if and outside the rectangular pattern projection area PA inscribed therewith.

In the present embodiment, it is to be understood that the distance Dy from the center position of the spot light LAx in y direction to the optic axis AX and the distance Dx from the center position of the spot light LAy in x direction to the optic axis AX are preknown during the manufacture of the apparatus. Where the light spots LAx and LAy are not coincident with the y-axis and the x-axis, respectively, the distances Dy and Dx from the point of intersection at which a line passing through the center of the light spot LAx and parallel to the y-axis is orthogonal to a line passing through the center of the light spot LAy and parallel to the x-axis (this point of intersection will hereinafter be referred to as PP) to the light spots LAx and LAy, respectively, may be pre-known.

Figure 3:
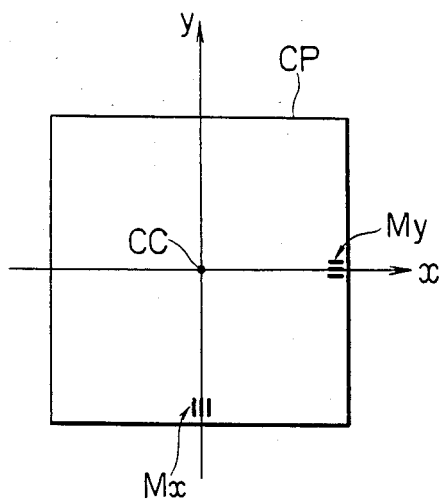
FIG. 3 shows the arrangement of alignment marks attendant to the chips on a wafer.
Figure 4:
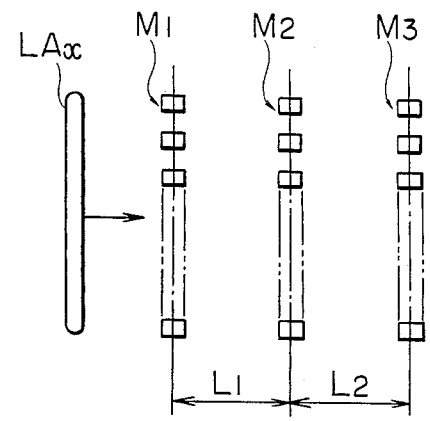
FIG. 4 is an enlarged view of a grating pattern as a plurality of alignment marks.

A plurality of chips CP are arranged in the form of a matrix on the wafer 3, and as shown in FIG. 3, an x direction alignment mark Mx and a y direction alignment mark My are provided on each chip CP. For simplicity of description, it is to be understood that these marks Mx and My are disposed so as to lie on the x-axis and the y-axis around the chip CP when the center CC of the chip CP is made coincident with the origin of the coordinates system xy. Of course, this is not always necessary. In the present embodiment, each of the marks Mx and My has three diffraction grating-like line patterns, and the central one of the three line patterns is positioned on the x-axis and the y-axis, respectively. FIG. 4 is an enlarged plan view of the mark Mx. As shown there, the three diffraction grating patterns M1, M2 and M3 extend in parallelism to the y-axis at intervals L1 and L2 in y direction. This also holds true of the mark My. The intervals L1 and L2 are determined to such a degree that the grating patterns M1, M2 and M3 can be detected independently of one 5 another by the scanning of the light spot, for example, to L1=L2=30 μm when the width of each pattern M1, M2, M3 is on the order of 5 μm.

Figure 5:
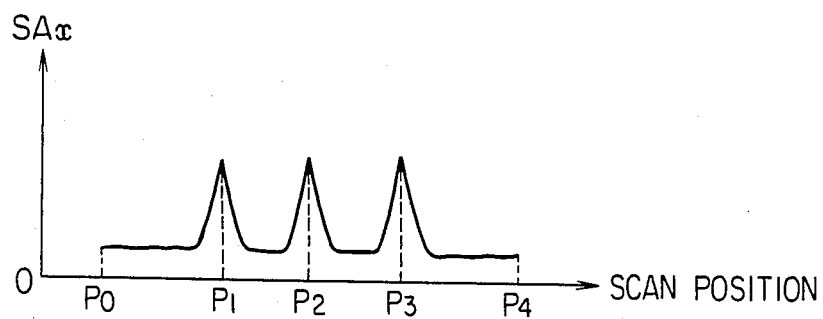
FIG. 5 shows the wave form of a photoelectric signal.

Operation of the present embodiment will now be described. The wafer 3 is first roughly aligned by a prealignment device, not shown, and then placed on the stage 4. A reference mark equivalent to the alignment mark of the wafer 3 is provided on the stage 4 and, if the stage 4 is positioned so that this reference mark overlaps the light spots LAy and LAx, the alignment of the wafer 3 (or the chip CP) relative to the light spots LAy and LAx is substantially accomplished. The stage 4 is then positioned by the controlling device 23 and the measuring machine 21, and the mark Mx attendant to the chip CP to be superposedly exposed and the light spot LAx are aligned with each other as shown, for example, in FIG. 4. In this state, the stage 4 is moved by a predetermined distance in x direction and the light spot LAx and the grating patterns M1, M2, M3 are relatively scanned in the direction of arrangement thereof. The scanning range is determined to a range including the grating patterns M1, M2, M3 and sufficiently greater than the length of the sum of the intervals L1 and L2. Now, the time-serial wave form of the photoelectric signal SAx is changed by the relative scanning of the light spot LAx as shown in FIG. 5. In FIG. 5, the abscissa represents the scan position of the stage 4 in x direction and the ordinate represents the intensity of the photoelectric signal SAx. If the position when the light spot LAx has been aligned as shown in FIG. 4 is $P_0$, the processing circuit 22 causes the sampled wave form of the photoelectric signal SAx put out from the position $P_0$ to the scan terminated position $P_4$ of the stage 4 to be stored in a memory. The processing circuit 22 detects, for example, the peak positions $P_1$, $P_2$ and $P_3$ in this wave form as the scan positions of the grating patterns M1, M2 and M3. Since the grating patterns M1, M2 and M3 are of the same shape, they perform the function as individually independent alignment marks. Generally, the deviation of the accuracy with which an alignment mark is detected is represented by a statistic amount $\sigma$, and this deviation $\sigma$ is the amount of error of the positon detection or alignment. Therefore, the deviation of each of the scan positions $P_1$, $P_2$ and $P_3$ of the three grating patterns M1, M2 and M3 is also $\sigma$. So, the processing circuit 22 averages the three scan positions $P_1$, $P_2$ and $P_3$ and calculates positional information $P_x$. That is, it effects the operation of $P_x=(P_1+P_2+P_3)/3$. The amount of deviation $\sigma m$ of the positional information $P_x$ obtained by this averaging operation is represented as $\sigma m=\sigma/\sqrt{3}$ by an ordinary statistic technique. That is, the error is small as compared with the amount of deviation $\sigma$ when only one alignment mark is detected and the position thereof is detected, and thus, the accuracy of the position detection is improved. In the present embodiment, the three grating patterns M1, M2 and M3 are scanned by the light spot, but if n grating patterns are provided, the amount of deviation of the positional information $P_x$ obtained by the averaging will be represented as $\sigma m=\sigma/\sqrt{n}$ greater improvement of the accuracy of the position detection can be expected as n becomes greater.

Now, in the present embodiment, the intervals L1 and L2 between the grating patterns M1, M2 and M3 are equal intervals of 30 μm and therefore, the positional information $P_x$ is of a value very approximate to the scan position $P_2$. Subsequently, as regards the mark $M_y$ also, it is likewise scanned in y direction by the light spot $LA_y$ and the average positional information $P_y$ of the three grating patterns is obtained. On the basis of the thus obtained positional information $P_x$ and $P_y$, the controlling device 23 positions the stage 4. More specifically, the driving part 20 is servo-controlled so that the position of the stage 4 detected by the measuring machine 21 becomes equal to the positional information $P_x$, $P_y$. By this positioning, the light spot $LA_x$ is positioned on the y-axis in FIG. 3 and the light spot $LA_y$ is positioned on the x-axis in FIG. 3, and the center CC of the chip CP and the optic axis AX of the projection lens 1 (or the center of projection of the reticle 5) are precisely aligned. Thereafter, the shutter in the illuminating optical system is opened for a predetermined time, whereby the projected image of the circuit pattern of the reticle 5 is accurately superposedly exposed on the chip CP.

Figure 6:
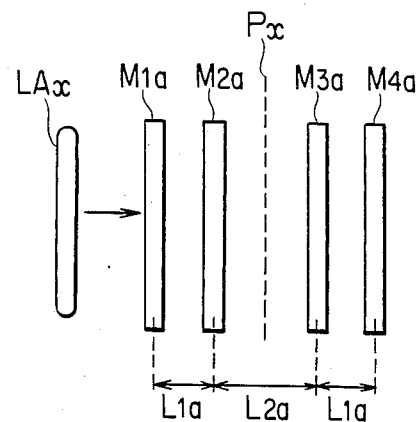
FIG. 6 is a plan view showing another example of the alignment mark.

In the present embodiment, as described above, the three grating patterns M1, M2 and M3 are detected as a plurality of alignment marks, but depending on the construction of the alignment optical system, a plurality of simple linear patterns may be detected. In this case, it is desirable to detect the scattered light produced by the level difference edge of the linear patterns. Also, where the number of the plurality of alignment marks is odd and the intervals therebetween are equal as in the present embodiment, the scan position of the middle one of those marks is coincident with the averaged positional information, but where the number of the alignment marks is odd but the intervals therebetween are not equal or where the number of the alignment marks is even as shown in FIG. 6, the positional information obtained by the averaging represents an imaginary position on the wafer at which no mark can actually exist. When, as shown in FIG. 6, a mark $M_x$ comprising four parallel linear patterns M1a, M2a, M3a and M4a is scanned by the light spot $LA_x$, if the interval between the linear patterns M1a and M2a and the interval between the linear patterns M3a and M4a are L1a and the interval between the linear patterns M2a and M3a is L2a (L2a≠L1a), the positional information $P_x$ represents the central position of the linear patterns M2a and M3a in y direction. Even in this case, if the positional information $P_x$ is predetermined as a value to be position-detected, the alignment of the reticle 5 and the chip CP can be accomplished just in the same manner. Further, the light spots $LA_x$ and $LA_y$ in the present embodiment may be circular spots. Particularly, if the wavelengths of these light spots are made to differ from the wavelength of the exposure light and these light spots are light of wavelengths which do not sensitize the photoresist of the wafer 3, the light spots can be applied to any other part of the wafer 3 than the mark and therefore, there is no limit in the range of the relative scanning of the light spots and the wafer and any variation in reflection factor and refractive index by the absorption of the exposure light into the photoresist does not occur and thus, high-speed position detection can be expected.

Also, in the processing circuit 22 of the present embodiment, the simple averaging operation with the scan position as a variable has been effected, but an entirely similar effect may be obtained even if this operation is changed to a weighted average process or a minimum square approximation process. Also, in another embodiment, once global alignment has been effected, the processing circuit 22 can find, for example, the positions of the patterns M1-M3 by an operation and find the average $\Delta P_x = (\Delta P_1 + P_2 + \Delta P_3)/3$ of the differences $\Delta P_1$, $\Delta P_2$ and $\Delta P_3$ between said positions and the positions of the patterns M1-M3 detected by the light spot. Where the design distances $x_1$, $x_2$ and $x_3$ from the scan starting point $P_0$ on the wafer to the grating patterns M1, M2 and M3, respectively, are preknown, the amount of error of each mark can be found from the differences between the actually measured values $P_1$, $P_2$, $P_3$ of the respective marks $M_1$, $M_2$, $M_3$ and the design distances.

The position obtained by correcting the averaged error $\Delta P_x$ from the actually measured value of a grating pattern, e.g., M1, is regarded as the positional information representative of the whole of the mark $M_x$. The processing circuit 22 carries out said operation, i.e., the operations of steps 100-104 of the flow chart of FIG. 8.

Now, in the present embodiment, the processing circuit 22 is caused to store therein the wave form of the photoelectric signal SA and therefore, the scanning of the mark $M_x$ by the light spot $LA_x$ and the scanning of the mark $M_y$ by the light spot $LA_y$ (the stage scan) should only be effected once, and the detection of the marks is accomplished within a very short time. Further, by causing the wave forms of the photoelectric signals $SA_x$ and $SA_y$ to be stored, evaluation of the wave forms can also be accomplished by various digital operation processes. A method of reducing the misrecognition of the marks will hereinafter be described as an example of the evaluation. In the present embodiment, this method is executed before the average position of the marks is detected. The wave forms of the photoelectric signals $SA_x$ and $SA_y$ are not always neat (good in S/N ratio) as shown in FIG. 5 under the influence of the irregularity of the reflection factor of the surface of the wafer 3, the adherence of fine particles, the deformation of the marks by the process, etc., and sometimes, in addition to the peaks corresponding to the marks, a plurality of similar peaks may occur. Therefore, the processing circuit 22 extracts the peak positions on those wave forms and judges whether the intervals L1, L2, L1a-L4a between the plurality of peaks are all equal to the design intervals between the plurality of alignment marks. Thus, the misrecognition of the marks can be reduced even if the photoelectric signals $SA_x$ and $SA_y$ are poor in S/N ratio. Thereafter, the averaging is effected as in the present embodiment by using the scan positions of the thus detected marks. If the misrecognition of the marks can be so reduced, global alignment for positioning the entire wafer in the apparatus can be accomplished by the use of the TTL (through the lens) type alignment optical system shown in FIG. 1. In the global alignment, the scanning range of the light spot is sometimes made wider than during the chip alignment of the present embodiment and thfore, there is a high possibility that peaks corresponding to the scattered light from the scribe lines around the chip or the circuit pattern portion in the chip, in addition to from the marks, appear on the wave forms of the photoelectric signals. Therefore, the recognition rate of the marks must be made high, but if said method is added, there will be no possibility of recognizing the scribe lines as marks during the global alignment and also, highly accurate alignment can be achieved by the averaging.

Figure 7:
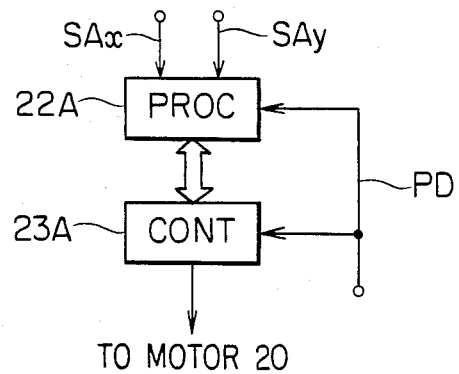
FIG. 7 is a block diagram of a part of another embodiment of the present invention.
Figure 9:
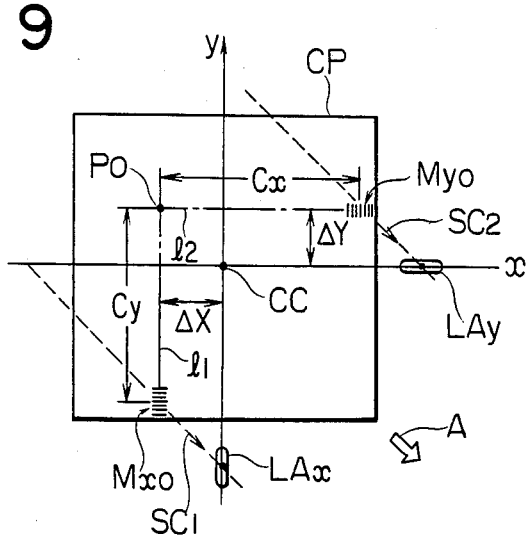
FIG. 9 is a chip arrangement view showing the manner of position detecting operation by still another embodiment of the present invention.

FIG. 9 is a plan view showing the arrangement of marks on a wafer 3 in another embodiment of the present invention. In FIG. 7, there are shown, in block diagram, the processing circuit 22A and the controlling device 23A of another embodiment of the present invention. The apparatus of said another embodiment of the present invention differs from the apparatus of the previously described embodiment in the processing circuit and the controlling device. On the wafer 3, a plurality of chips CP are disposed in the form of a matrix and, as shown in FIG. 9, an x direction alignment mark $M_{x0}$ extending in y direction and a y direction alignment mark $M_{y0}$ extending in x direction are provided on different portions of each chip. When the center CC of the chip CP is made coincident with the origin of the coordinates system xy, the mark $M_{x0}$ is provided at a position spaced apart by $\Delta X$ in x direction from the y-axis around the chip CP and the mark $M_{y0}$ is provided at a position spaced apart by $\Delta Y$ in y direction from the x-axis around the chip CP. Further, in the present embodiment, when the point of intersection at which a segment $l_1$ passing through the center of the mark $M_{x0}$ and parallel to the y-axis is orthogonal to a segment $l_2$ passing through the center of the mark $M_{y0}$ and parallel to the x-axis is $P_0$, the distance $C_y$ from the point of intersection $P_0$ to the mark $M_{x0}$ is determined so as to be equal to the distance $D_y$ of the light spot $LA_x$ from the optic axis AX (or the point of intersection PP), and the distance $C_x$ from the point of intersection $P_0$ to the mark $M_{y0}$ is determined so as to be equal to the distance $D_x$ of the light spot $LA_y$ from the optic axis AX (or the point of intersection PP).

Figure 8:
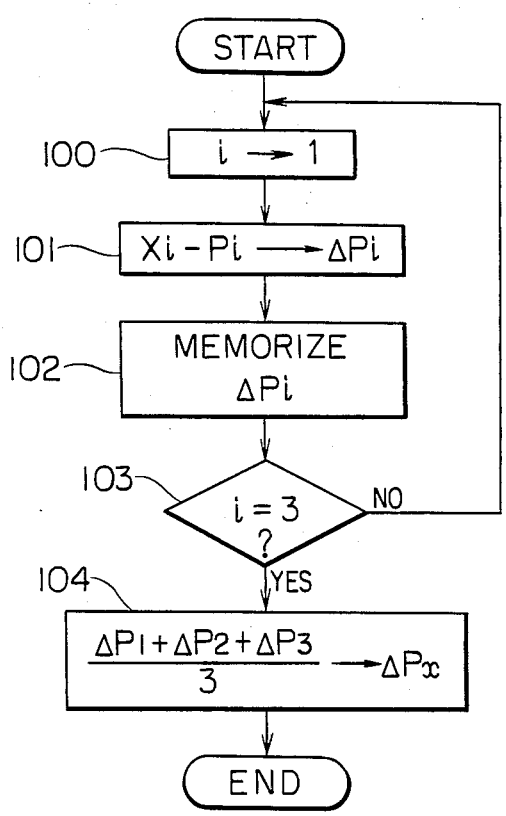
FIG. 8 is a flow chart showing the operation of the processing circuit.
Figure 10A:
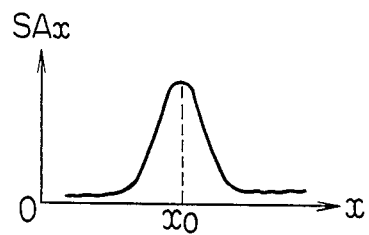
FIGS. 10A and 10B show the wave forms of photoelectric signals in yet another embodiment of the present invention.
Figure 10B:
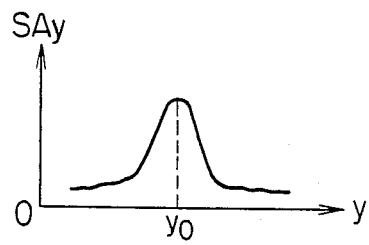

The operation of position detection by the embodiment shown in FIG. 8 will now be described by reference to FIGS. 9, 10A and 10B. FIGS. 10A and 10B show the wave forms of the photoelectric signals $SA_x$ and $SA_y$, respectively, and in these Figures, the abscissa represents the scan position in x direction or y direction and the ordinate represents the intensity of each photoelectric signal. The wafer 3 is first roughly positioned by a prealignment apparatus, not shown, and then is placed on the stage 4. Further, the two-dimensional positional deviation and rotational deviation of the entire wafer 3 relative to the optic axis AX of the projection lens are global-aligned by the use of an off-axis alignment microscope (not shown) for detecting the marks formed at two spaced apart locations on the wafer 3. By the above-described operation, the arrangement coordinates system of each chip on the wafer 3 and the movement coordinates system of the stage 4, i.e., the xy coordinates system, are made to correspond to each other in a primary relation. Accordingly, if the controlling device 23A reads the positional information PD from the measuring machine 21 and drives the driving part 20 and positions the stage 4 so that the position changes along the chip arrangement coordinates of the wafer 3, alignment can be accomplished so that the optic axis AX of the projection lens 1 passes substantially through the center CC of a chip CP on the wafer 3. Subsequently, precise alignment of the projected image of the pattern area PA and a chip CP on the wafer 3 is effected. For this purpose, the controlling device 23A positions the stage 4 so that the arrangement relation between the chip CP and the two sopt lights $LA_x$, $LA_y$ deviates by a predetermined distance in an oblique direction, a search direction inclined by 45°, for example, in both of x direction and y-direction, as shown in FIG. 9. FIG. 9 shows a state in which, by said positioning, the optic axis AX and the center CC of the chip CP have been made substantially coincident with each other. From this state, the controlling device 23A rectilinearly moves the stage 4 in the oblique search direction of 45° as indicated by arrow A in FIG. 9. More specifically, the stage scanning is effected along a segment passing through a point (in FIG. 9, substantially the center CC) on the chip CP through which the optic axis AX passes and the point of intersection $P_0$ between segments 11 and 12. Thus, the mark $M_{x0}$ moves along a scanning orbit (Search orbit) SC1 so as to obliquely cross the light spot $LA_x$ at 45°, and the mark $M_{y0}$ moves along a scanning orbit (search orbit) SC2 so as to obliquely cross the light spot $LA_y$ at 45°. At this time, in the present embodiment, the point of time at which the mark $M_{x0}$ overlaps the light spot $LA_x$ and the point of time at which the mark $M_{y0}$ overlaps the light spot $LA_y$ are substantially coincident with each other because $D_y=C_y$ and $D_x=C_x$, as previously described. Strictly, however, minute positional deviations in x direction and y direction remain in the state at the scan starting point of time as shown in FIG. 9 due to the accuracy of the prealignment and global alignment of the wafer 3 and thus, the points of time at which the light spots $LA_x$ and $LA_y$ detect the marks $M_{x0}$ and $M_{y0}$, respectively, deviate very slightly in conformity with the amounts of said minute positional deviations.

Now, when the mark $M_{x0}$ crosses the light spot $LA_x$ at 45°, the photoelectric signal $SA_x$ assumes a peak in conformity with the variation in the intensity of the high-order diffracted light from the mark $M_{x0}$ as shown in FIG. 10A. The photoelectric signal $SA_y$ also assumes a similar peak wave form as shown in FIG. 10B. The processing circuit 22A processes the x direction positional information of the stage 4, of the positional information PD from the measuring machine 3, and the photoelectric signal $SA_x$ thereof, and detects the x direction position $x_0$ corresponding, for example, to the peak point of the photoelectric signal $SA_x$. Likewise, the processing circuit 22A processes the y direction positional information of the stage 4 and the photoelectric signal $SA_y$, and detects the y direction position $y_0$ corresponding to the peak of the photoelectric signal $SA_y$. The processing circuit 22A has a circuit for sampling and storing the magnitudes of the photoelectric signals $SA_x$ and $SA_y$ for each unit amount of movement of the stage 4 in x direction and y direction and therefore can detect both of the positions $x_0$ and $y_0$ simply by obliquely scanning the stage 4 only once. The position $x_0$ is the x direction position of the segment $l_1$ passing through the center of the mark $M_{x0}$, and the position $y_0$ is the y direction position of the segment $l_2$ passing through the center of the mark $M_{y0}$. Thus, by the above-described position detecting operation, the two-dimensional positional relation of the chip CP to the light spots $LA_x$ and $LA_y$, namely, the positional relation between the optic axis AX and the point of intersection $P_0$, has been made to correspond precisely.

Now, the marks $M_{x0}$ and $M_{y0}$ are at positions whereat they have passed the light spots $LA_x$ and $LA_y$, respectively, by the stage scanning. Thus, the processing circuit 22A puts out to the controlling device 23A positions $(x_0+\Delta X, y_0+\Delta Y)$ obtained by adding the amounts of offset $\Delta X$ and $\Delta Y$ of the marks $M_{x0}$ and $M_{y0}$ predetermined to the values of the detected positions $x_0$ and $y_0$, as the positioning target position of the stage 4 relative to the optic axis AX. Thereupon, the controlling device 23A servo-controls the stage 4 so that the positional information PD from the measuring machine 21 becomes that target position. As a result, the optic axis AX of the projection lens 1 accurately passes through the center CC of the chip CP and precise alignment of the wafer 3 is accomplished. Thereafter, the exposure light is applied to the reticle 5 and the pattern is superposedly exposed on the chip CP on the wafer 3.

As described above, in the present embodiment, $Dy=Cy$ and $Dx=Cx$ and the stage scanning is effected obliquely at 45° and therefore, the detection of the marks $M_{x0}$ and $M_{y0}$ becomes possible substantially at the same time. Therefore, the scanning distance of the stage scanning at 45° (the search distance of the marks) can be shortened, and this leads to an advantage that the time required for alignment is very short. If $Dy=Cy$ and $Dx=Cx$, simultaneous detection of the marks $M_{x0}$ and $M_{y0}$ is possible even if the direction of the stage scanning is other than 45°. The aforementioned movement of the stage 4 has been described as rectilinear movement in the direction of arrow A, but the present invention also covers a case where the stage 4 is moved by a minute amount (an amount smaller than the lengthwise dimensions of the marks $M_{x0}$ and $M_{y0}$) alternately in x direction and y direction.

Figure 11:
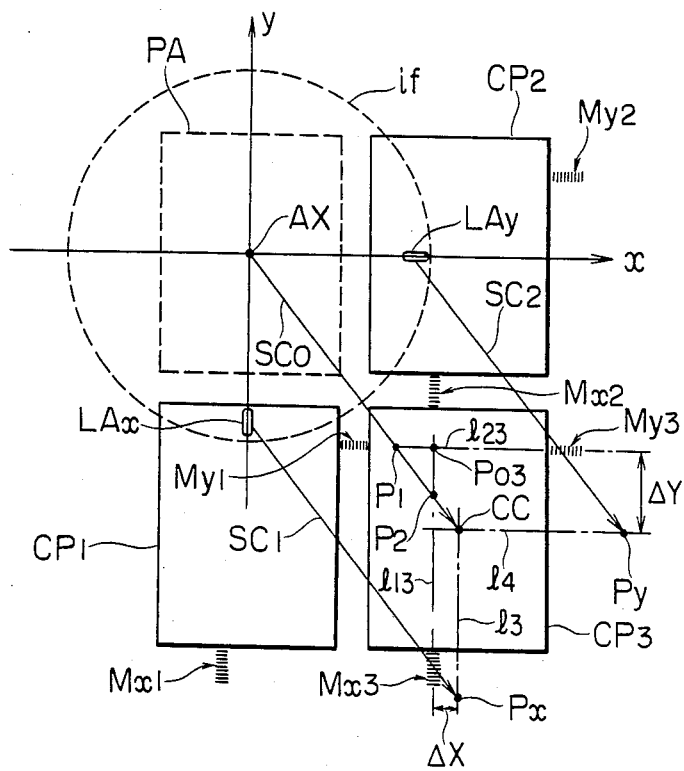
FIG. 11 is a chip arrangement view showing the manner of alignment operation by a further embodiment of the present invention.

The embodiment of FIG. 11 has a feature in that the direction of the stage scanning in the aforedescribed position detecting operation is made coincident with the direction of stepping for exposing the next chip. That is, the stage 4 is not caused to step only in x direction and y direction relative to the plurality of chips arranged in the form of a matrix on the wafer 3, but is caused to step so that a chip positioned obliquely adjacent to the chip being exposed is exposed. FIG. 11 shows the arrangement relation immediately after a particular chip on the wafer 3 and the projected pattern image PA have been superposedly exposed. As in FIG. 9, marks $M_{x1}$ and $M_{y1}$, marks $M_{x2}$ and $M_{y2}$ and Marks $M_{x3}$ and $M_{y3}$ are provided on the chips $CP_1$, $CP_2$ and $CP_3$, respectively, on the wafer 3. In the present embodiment, the stage 4 is rectilinearly moved obliquely along a scanning orbit $SC_0$ so that the center CC of the chip $CP_3$ positioned obliquely adjacent to the exposed chip is coincident with the optic axis AX of the projection lens 1 (or the central point of the projected pattern image PA). The distance of this scanning orbit $SC_0$ can be pre-found by a simple operation because the arrangement pitch of the chips is known. Now, the scanning orbits $SC_1$ and $SC_2$ of the light spots $LA_x$ and $LA_y$ when the stage 4 is moved along the scanning orbit $SC_0$ become parallel to the scanning orbit $SC_0$. At this time, the mark $M_{x3}$ attendant to the chip $CP_3$ is positioned on the scanning orbit $SC_1$ and the mark $M_{y3}$ is positioned on the scanning orbit $SC_2$. The marks attendant to the other chips $CP_1$ and $CP_2$ are also arranged just likewise. Also, in the present embodiment, the positions of the marks $M_{x3}$ and $M_{y3}$ relative to the point of intersection $P_{03}$ between a segment $l_{13}$ passing through the center of the mark $M_{x3}$ and parallel to the y-axis and a segment passing through the center of the mark $M_{y3}$ and parallel to the x-axis, i.e., the distances Cy and Cx, are determined to $Dy \neq Cy$ and $Dx \neq Cx$ unlike the case shown in FIG. 9. Further, the amount of x direction offset $\Delta X$ of the segment $l_3$ passing through the center CC of the chip $CP_3$ and parallel to the y-axis and the mark $M_{x3}$ and the amount of y direction offset $\Delta Y$ of the segment $l_4$ passing through the center CC of the chip $CP_3$ and parallel to the x-axis and the mark $M_{y3}$ are both pre-known.

So, when the stage 4 is rectilinearly moved from the state of FIG. 11 along the scanning orbit $SC_0$ for the exposure of the chip $CP_3$, the mark $M_{y3}$ overlaps the light spot $LA_y$ when the optic axis AX of the projection lens 1 is positioned at a point $P_1$ on the scanning orbit $SC_0$. When the stage 4 is further moved and the optic axis AX is positioned at a point $P_2$ on the scanning orbit $SC_0$, the mark $M_{x3}$ overlaps the light spot $LA_x$. Since the amount of one cycle of movement to the next chip during the exposure is substantially constant, the processing circuit 22A pre-stores this amount of movement, detects on the basis of the stored amount of movement the point of time at which the light spot $LA_y$ is positioned near the mark $M_{y3}$, starts sampling the photoelectric signal $SA_y$, discontinues the sampling at a point of time whereat the light spot $LA_y$ has completely crossed the mark $M_{y3}$, and starts the operation process of detecting the y direction position (scan position) $y_3$ of the mark $M_{y3}$. Further, the processing circuit 22A puts out to the controlling device 23A a position $(y_3+\Delta Y)$ obtained by adding (or subtracting) the detected position $y_3$ to (or from) the amount of offset $\Delta Y$, as the y direction stoppage target position of the stage 4. This also holds true of the detection of the mark $M_{x3}$, and the processing circuit 22A starts the operation process of detecting the x direction position $x_3$ of the mark $M_{x3}$ from immediately after the light spot $LA_x$ has crossed the mark $M_{x3}$, and puts out the x direction stoppage target position $(x_3+\Delta X)$ of the stage 4 to the controlling device 23A. It is desirable that the time from the point of time at which the light spots $LA_x$ and $LA_y$ have completed the scanning of the marks $M_x$ and $M_y$, respectively, until the stoppage target position $(x_3+\Delta X, y_3+\Delta Y)$ of the stage 4 is calculated (hereinafter referred to as the detection process time) be sufficiently short. For example, by using an exclusive high-speed processor as the processing circuit 22A, high-speed processing of the order of 10 m sec. is possible. Now, at the point of time whereat the target position $(x_3+\Delta X, y_3+\Delta Y)$ has been calculated, the controlling device 23A positions the stage 4 by servo control so that the two-dimensional position of the stage 4 is the target position $(x_3+\Delta X, y_3+\Delta Y)$ while reading the current position (positional information PD) of the stage 4. By the above-described operation, the optic axis AX of the projection lens 1 (or the center of the projected pattern image PA) becomes accurately coincident with the center CC of the chip $CP_3$ and thus, the projected pattern image PA and the chip $CP_3$ have become precisely superposed one upon the other. When this alignment has been completed, the light spot $LA_x$ is positioned at a point $P_x$ and the light spot $LA_y$ is positioned at a point $P_y$. According to the present embodiment, as described above, the design is such that when the next chip has been caused to step obliquely for the exposure thereof, the mark $M_{x0}$ or $M_{x3}$ and the mark $M_{y0}$ or $M_{y3}$ are positioned on the scanning orbits $SC_1$ and $SC_2$, respectively, of the light spots $LA_x$ and $LA_y$ and therefore, there is obtained the effect that precise alignment can be accomplished within a very short time without the stage 4 being stopped during the time from the mark position detecting operation till the stepping for the exposure operation.

In the present embodiment, as is apparent from FIG. 11, because of the arrangement relation between the marks $M_{x3}$ and $M_{y3}$, the mark $M_{x3}$ is detected later than the mark $M_{y3}$ and moreover, the amount of offset $\Delta X$ of the mark $M_{x3}$ is small and therefore, the time required for the detection of the position $(x_3+\Delta X)$ may sometimes be longer than the time required for the optic axis AX to be moved from the point $P_2$ to the center CC. In such case, it is also necessary to stop the stage 4 at or short of a position whereat the optic axis AX of the projection lens 1 has passed through the center CC of the chip $CP_3$. When it is not desired to stop the stage 4, the feeding speed of the stage 4 may be slowed down in accordance with the detection process time at or immediately before the point of time whereat the mark $M_{x3}$ has been detected by the light spot $LA_x$. However, the stoppage or the speed reduction of the stage 4 may cause the throughput of the exposure apparatus to be reduced. So, the arrangement of the marks is changed as shown in FIG. 12.

Figure 12:
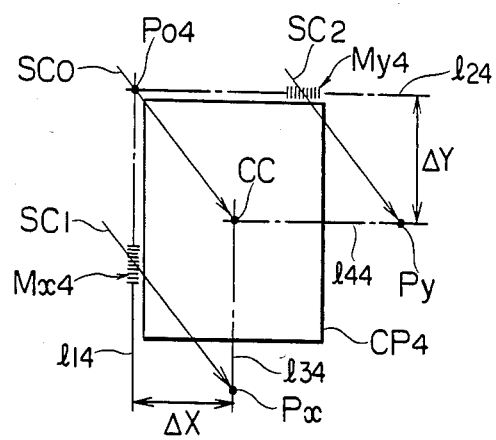
FIG. 12 shows a modification of the mark arrangement for the position detecting operation by still a further embodiment of the present invention.

The marks $M_{x4}$ and $M_{y4}$ of FIG. 12, like the mark arrangement shown in FIG. 9, are arranged so that the distances $C_y$ and $C_x$ are $D_y=C_y$ and $D_x=C_{x'}$, respectively, and that the point $P_{04}$ of intersection between the segments $l_{14}$ and $l_{24}$ is coincident with the scanning orbit $SC_0$ of the optic axis AX. That is, the position of the mark $M_{x4}$ is changed to a position spaced apart as much as possible from the point $P_x$ on the scanning orbit $SC_1$ of the light spot $LA_x$ (a position which can be formed attendantly to the chip $CP_4$) This also holds true of the position of the mark $M_{y4}$ with respect to the point $P_y$ on the scanning orbit $SC_2$. If this is done, the marks $M_{x4}$ and $M_{y4}$ are detected substantially at the same time and the time required for the optic axis AX of the projection lens 1 to reach the center CC of the chip $CP_4$ from the point of intersection $P_{04}$ becomes longer than the detection process time and thus, the operation such as the temporary stoppage or the speed reduction of the stage 4 becomes unnecessary. This leads to an advantage that the position detection, the alignment and the repeated operation of exposure are accomplished at higher speeds.

Figure 13:
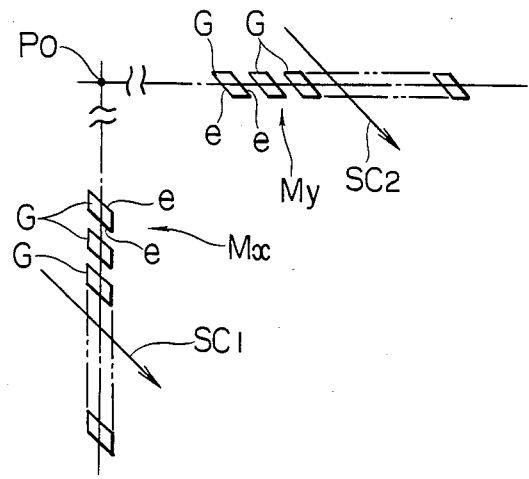
FIGS. 13 and 14 are enlarged views showing modifications of the marks as further embodiments of the present invention.
Figure 14:
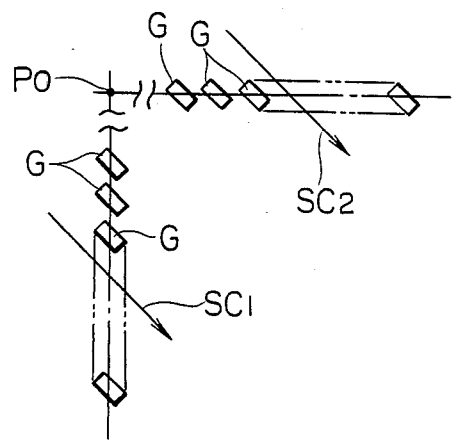

The marks hitherto shown are diffraction grating-like patterns, and more particularly orthogonal grating patterns in which the level difference edge of each grating contributing to the creation of high-order diffracted light is orthogonal to the direction in which the mark extends. However, when such orthogonal grating patterns are obliquely scanned by the light spots $LA_x$ and $LA_y$, the relative position of the level difference edge of the grating contributing to the creation of high-order diffracted light during the scanning of the mark and the light spots and the number of edges contributing to the creation of high-order diffracted light fluctuate depending on the relations with the width (spot size) of the light spots $LA_x$ and $LA_y$, the width of the marks and further the angle of oblique scanning. Therefore, the photoelectric signals $SA_x$ and $SA_y$ are subjected to modulation and may become slightly deformed relative to the wave forms of the photoelectric signals when the marks $M_x$ and $M_y$ have been scanned in a direction orthogonal to the lengthwise direction thereof. Such deformation of the wave forms may cause the mark position detection accuracy to be reduced. So, as shown in FIGS. 13 and 14, gratings G each having a level difference edge e extending in the direction of stage scanning are made into an oblique grating pattern arranged in x direction or y direction. In FIG. 13, each of the marks $M_x$ and $M_y$ comprises gratings G each having an edge e parallel to the scanning orbit $SC_1$, $SC_2$ of the light spot $LA_x$, $LA_y$, and the shape of the gratings G is a parallelogram. Moreover, the two edges of the grating G in each mark position detection direction (x or y direction) are determined so as to be parallel to lines passing through the centers of the marks $M_x$ and $M_y$. In the oblique grating pattern of FIG. 14, the gratings G have simply been changed to a rectangular shape. Thus, by making each mark into an oblique grating pattern in which the direction of the edge e of the grating G contributing to the creation of diffracted light is coincident with the scanning direction of the stage 4, the photoelectric signals are not subjected to modulation as previously described and it becomes possible to detect the positions of the marks very precisely. Also, if the marks are made into an oblique grating pattern, the diffracted light or scattered light created from the other patterns (such as circuit pattern and scribe lines) on the wafer and the diffracted light created from the marks can be readily separated from each other by optimally choosing the shape of the light-intercepting portion of the space filter.

As described above, in each embodiment of the present invention, the photoelectric signals $SA_x$ and $SA_y$ are sampled and digitally processed, whereby the positions of the marks $M_x$ and $M_y$ are detected, but a similar effect may also be obtained by providing a circuit for comparing the photoelectric signals $SA_x$ and $SA_y$ with a predetermined slice level and transforming the same into a binary form, obtaining a pulse signal when the light spots have become coincident with the marks, and latching (temporarily storing) the positional information PD from the measuring machine 21 in response to the pulse signal. The marks $M_x$ and $M_y$ need not always be diffraction grating patterns, but may also be a simple linear pattern.

Further, the present invention, as shown in each embodiment, is not limited to position detection using an alignment optical system for detecting the position of a chip on the wafer not through a reticle but through the projection lens 1. For example, an alignment optical system for detecting the aligned state with respect to the marks $M_x$ and $M_y$ on the wafer provided on the reticle, i.e., the so-called die-by-die type alignment system, may also be used to obtain a similar effect. When the mark illuminating light (corresponding to the light spots $LA_x$ and $LA_y$) by the die-by-die type alignment optical system is of such a wavelength which sensitizes the photoresist of the wafer, the range of the oblique scanning by the stage 4 (the length of the scanning orbits $SC_1$ and $SC_2$) may be limited to a small area including the marks $M_x$ and $M_y$. The present invention can be carried out not only for the detection of the positions of the chips on the wafer, but also for the global alignment. For example, use may be made of two off-axis type alignment microscopes having the x direction and y direction detection centers at positions spaced apart by a predetermined distance in x direction and y direction from the optic axis AX of the projection lens 1. In this case, the detection centers of the two off-axis alignment microscopes correspond to the light spots $LA_x$ and $LA_y$ shown in FIG. 2. Accordingly, on the wafer, a mark for x direction and a mark for y direction may be provided at least at two locations corresponding to the positions of said detection centers. The stage 4 is obliquely scanned and the x direction and y direction positions of the stage 4 are latched when said detection centers have become coincident with the respective marks. If this is done, the two-dimensional position of the entire wafer relative to the detection centers of the off-axis alignment microscopes is prescribed. The off-axis type microscopes may conveniently be provided with an optical system for imaging an elongated light spot similar to the light spots $LA_x$ and $LA_y$ with such light spot as the detection center.

In each of the above-described embodiments, the light spots $LA_x$ and $LA_y$ are elongated sheet-like spots, but tiny circular spots may also result in a similar effect.

We claim:

1. An alignment system including:
   (a) a substrate on which a plurality of patterns are disposed, said plurality of patterns being arranged along a predetermined direction on said substrate, each of said patterns extending in a direction across said predetermined direction;
   (b) a stage means for holding said substrate;

(c) applying means for applying a light spot to said substrate held by said stage means;
(d) displacing means for imparting relative displacement between said substrate held by said stage means and said light spot;
(e) light detection means for detecting light from said plurality of patterns and for producing light detection signals;
(f) positon detection means for detecting positions of said plurality of patterns along said predetermined direction in response to said light detection signals and for producing position detection signals; and
(g) operation means responsive to said position detection signals for calculating an average value of said positions of said plurality of patterns along said predetermined direction.

2. An alignment system according to claim 1, wherein said patterns form a diffraction grating.

3. An alignment system according to claim 2, wherein said patterns are arranged at a predetermined interval along said predetermined direction.

4. An alignment system including:
(a) a substrate on which a mark is disposed, said mark being formed by a plurality of patterns, said patterns being arranged along a predetermined direction on said substrate, each of said patterns extending in a direction across said predetermined direction;
(b) position detection means for photoelectrically detecting positions of said plurality of patterns along said predetermined direction and for producing position detection signals; and
(c) operation means responsive to said position detection signals for calculating the position of said mark along said predetermined direction.

5. An alignment system according to claim 4, wherein said patterns form a diffraction grating.

6. An alignment system according to claim 5, further comprising a stage for holding said substrate.

7. An alignment system according to claim 4, wherein said position detection means comprises means for transducing light to electrical signals and means responsive to said electrical signals for detecting said positions of said plurality of patterns along said predetermined direction.

8. An alignment system according to claim 4, wherein said operation means calculates an average value of said positions of said plurality of patterns along said predetermined direction.

9. An alignment system including:
(a) a substrate on which a plurality of patterns are disposed, said plurality of patterns being arranged along a predetermined direction on said substrate, each of said patterns extending in a direction across said predetermined direction;
(b) stage means for holding said substrate;
(c) apply means for applying a light spot to said substrate held by said stage means;
(d) displacing means for imparting relative displacement between said substrate held by stage means and said light spot;
(e) light detection means for detecting light from said plurality of patterns and for producing light detection signals;
(f) position detection means for detecting positions of said plurality of pattern along said predetermined direction on said substrate in response to said light detection signals and for producing position detection signals;
(g) memory means for storing anticipated positions of said plurality of patterns along said predetermined direction on said substrate;
(h) means responsive to said position detection signals for calculating differences between said anticipated positions and positions indicated by said position detecton signals; and
(i) means for calculating an average value of said differences.

10. An alignment system including:
(a) a stage means for holding a substrate on which a plurality of patterns are disposed, said plurality of patterns being arranged along a predetermined direction on said substrate, each of said patterns extending in a direction across said predetermined direction;
(b) applying means for applying a light spot to said substrate held by said stage means;
(c) displacing means for imparting relative displacement between asid substrate held by said stage means and said light spot;
(d) light detection means for detecting light from said plurality of patterns and for producing light detection signals;
(e) position detection means for detecting positions of said plurality of patterns along said predetermined direction in response to said light detection signals and for producing position detection signals; and
(f) operation means responsive to said position detection signals for calculating an average value of positions of said plurality of patterns along said predetermined direction.

11. An apparatus for aligning an object bearing thereon one pattern for alignment in one direction and another pattern for alignment in another direction substantially orthogonal to said one direction, said apparatus comprising:
(a) holding means for holding said object;
(b) applying means for applying a first light spot and a second light spot to said object held by said holding means;
(c) displacing means for imparting relative displacement between said object held by said holding means and each of said first and second light spots without changing a relative displacement between said first light spot and said second light spot; and
(d) control means for causing said displacing means to impart said relative displacement in a predetermined direction which intersects said one direction and said another direction, respectively, so that said first light spot is superimposed on said one pattern and said second light spot is superposed on said another pattern during said displacement in said predetermined direction.

12. An apparatus according to claim 11, which further comprises light detection means for detecting light from said one pattern and said another pattern during said displacement in said predetermined direction and for producing light detection signals, and aligning means for aligning saids object in response to said light detection signals.

13. An apparatus according to claim 12, wherein said aligning means includes means for moving said holding means in two dimensional directions.

14. An apparatus for aligning an object bearing thereon one pattern for alignment direction and another pattern for alignment in another direction substantially orthogonal to said one direction, said apparatus comprising:

(a) holding means for holding said object;
(b) detection means having a first detection position and a second detection position, said detection means detecting that said one pattern is in said first detection position and producing a first detection signal, said detection means detecting that said another pattern is in said second detection position and producing a second detection signal;
(c) displacing means for imparting relative displacement between said substrate held by said holding means and said first and second detection positions; and
(d) control means for causing said displacing means to impart said relative displacement in a predetermined direction which intersects said one direction and said another direction, respectively, so that said first detection position is superimposed on said one pattern and said second detection position is superimposed on said another pattern during said displacement in said predetermined direction.

15. An apparatus according to claim 14, which further comprises aligning means responsive to said first and second detection signals for aligning said holding means.

16. An alignment system including:

(a) an object bearing thereon one diffraction grating which extends in a first direction and another diffraction grating which extends in a second direction substantially orthogonal to said first direction;
(b) holding means for holding said object;
(c) applying means for applying a first light spot and a second light spot to said substrate held by said holding means;
(d) displacing means for imparting relative displacement between said object held by said holding means and said first and second light spots; and
(e) control means for causing said displacing means to impart said relative displacement in a predetermined direction which intersects said first direction and said second direction, respectively, so that said first light spot is superimposed on said one diffraction grating and said second light spot is superimposed on said another diffraction grating during said displacement in said predetermined direction;
(f) each of said first and second diffraction gratings having a plurality of edges parallel to said predetermined direction.

* * * * *